US010754026B2

(12) United States Patent
Callewaert

(10) Patent No.: US 10,754,026 B2
(45) Date of Patent: Aug. 25, 2020

(54) SURFACE TREATMENT PATTERNS TO REDUCE RADAR REFLECTION AND RELATED ASSEMBLIES AND METHODS

(71) Applicant: VEONEER US, INC., Southfield, MI (US)

(72) Inventor: Clyde M. Callewaert, Shelby Township, MI (US)

(73) Assignee: Veoneer US, Inc., Southfield, MI (US)

( * ) Notice: Subject to any disclaimer, the term of this patent is extended or adjusted under 35 U.S.C. 154(b) by 310 days.

(21) Appl. No.: 15/614,296

(22) Filed: Jun. 5, 2017

(65) Prior Publication Data
US 2018/0351274 A1 Dec. 6, 2018

(51) Int. Cl.
G01S 13/88 (2006.01)
H01Q 1/32 (2006.01)
H01Q 1/42 (2006.01)
G01S 13/931 (2020.01)
G01S 7/02 (2006.01)

(52) U.S. Cl.
CPC ............ G01S 13/88 (2013.01); G01S 13/931 (2013.01); H01Q 1/3233 (2013.01); H01Q 1/3283 (2013.01); H01Q 1/422 (2013.01); G01S 2007/027 (2013.01); G01S 2013/93277 (2020.01); H01Q 1/421 (2013.01); H05K 2201/09 (2013.01); H05K 2201/09036 (2013.01); H05K 2201/09118 (2013.01)

(58) Field of Classification Search
CPC .. G01S 13/931; H01Q 1/3233; H01Q 1/3283; H01Q 1/422; H01Q 1/421; H01Q 17/008
See application file for complete search history.

(56) References Cited

U.S. PATENT DOCUMENTS

| 5,446,470 A | 8/1995 | Avignon et al. |
| 6,366,234 B1 | 4/2002 | Katayama |
| 6,496,138 B1 | 12/2002 | Honma |
| 7,535,406 B2 | 5/2009 | Teranishi et al. |

(Continued)

FOREIGN PATENT DOCUMENTS

DE 102008010171 A1 8/2009
DE 102011115829 * 10/2011 ........... H01Q 1/3233

(Continued)

OTHER PUBLICATIONS

DE102011115829A1 Machine Translation of Application.

(Continued)

Primary Examiner — Marc Anthony Armand
(74) Attorney, Agent, or Firm — Matthew D. Thayne; Thayne and Davis LLC

(57) ABSTRACT

Surface treatment methods for improving electromagnetic interaction characteristics and related assemblies. In some embodiments, a vehicle RADAR assembly may comprise a RADAR module, a housing, and a surface having a plurality of parallel grooves defining a plurality of pointed projections. The plurality of grooves may be configured to decrease the reflectivity of electromagnetic radiation from the RADAR module relative to the housing and/or to de-cohere reflected radiation. In some embodiments, the grooves may be specifically sized and/or shaped to improve upon the RADAR signal interaction characteristics of the housing or other element having the surface.

16 Claims, 5 Drawing Sheets

(56) References Cited

U.S. PATENT DOCUMENTS

| | | | |
|---|---|---|---|
| 8,803,728 | B2 | 8/2014 | Yonemoto et al. |
| 2003/0146866 | A1* | 8/2003 | Hayashi ............... H01Q 17/008 342/1 |
| 2004/0036645 | A1* | 2/2004 | Fujieda .................. G01S 7/032 342/70 |
| 2009/0226673 | A1* | 9/2009 | Friedersdorf ............ C09D 7/70 428/167 |
| 2012/0225255 | A1 | 9/2012 | Reeder |
| 2013/0015999 | A1* | 1/2013 | Alland .................. G01S 7/4026 342/70 |
| 2014/0070982 | A1 | 3/2014 | Inada et al. |
| 2016/0268693 | A1 | 9/2016 | Ding et al. |

FOREIGN PATENT DOCUMENTS

| | | |
|---|---|---|
| DE | 102011115829 A1 | 4/2013 |
| EP | 0468658 A2 | 1/1992 |
| WO | 2016182567 | 11/2016 |

OTHER PUBLICATIONS

DE102008010171A1 Machine Translation of Application.
International Search Report for PCT/US2018/036152, dated Oct. 1, 2018, 2 pgs.
Written Opinion for PCT/US2018/036152, dated Oct. 1, 2018, 8 pgs.

* cited by examiner

SURFACE TREATMENT PATTERNS TO REDUCE RADAR REFLECTION AND RELATED ASSEMBLIES AND METHODS

SUMMARY

Typically, it is desirable to form materials used adjacent to RADAR sensors with a thickness that is an integer multiple of half-wavelengths of the radio waves that will extend through the material to decrease the reflectivity of the material relative to the RADAR signal. Similarly, it is often desirable to avoid thicknesses that are at integer multiples of quarter-wavelengths of such electromagnetic radiation because reflectivity tends to be high at these thicknesses. However, due to manufacturing constraints, design constraints, or other reasons, it may be difficult to alter manufacturing, such as injection molding processes, to accommodate such concerns effectively.

For example, in multi-shot injection molding processes, the material thickness resulting from one stage/shot of the process may be less than ideal from the standpoint of RADAR reflectivity and adding another stage/shot may not improve, or not significantly improve, upon these aspects of the material. It may be the case, for example, that an ideal thickness of the material is in between the thickness provided by the two stages/shots. In addition, providing smooth surfaces tends to preserve the coherence of reflected RADAR signals, which may be undesirable.

The present inventors have therefore determined that it would be desirable to provide systems and methods that overcome one or more of the foregoing limitations and/or other limitations of the prior art. Thus, in some embodiments, the inventive concepts disclosed herein may be used to form a roughened and/or textured surface, such as a surface comprising a plurality of grooves, for example, which may serve dual functions of decreasing an effective thickness of the material to reduce its reflectivity relative to radio waves or other electromagnetic radiation with which the material will be used, and also de-cohere reflected electromagnetic radiation to improve sensor functionality.

In some embodiments, various parameters/aspects of the grooves or other surface treatment may be tuned as needed, in some cases in accordance with the accompanying radio waves or other electromagnetic radiation. For example, in some embodiments, the grooves may be formed in parallel rows that are cross-polarized, or at least substantially cross-polarized, relative to the accompanying radio waves or other electromagnetic radiation. Additionally, or alternatively, the periodicity and/or depth of the grooves may be tied to the accompanying radio waves or other electromagnetic radiation, as described in detail below.

In a more particular example of a vehicle light assembly according to certain embodiments, the assembly may comprise a RADAR module, which may comprise one or more RADAR sensors and/or antennae, a vehicle light, and a housing enclosing the RADAR module and the vehicle light. At least a portion of the housing may comprise a plurality of grooves configured to decrease the reflectivity of electromagnetic radiation from the RADAR module relative to the at least a portion of the housing.

In some embodiments, the assembly may be configured for use as a vehicle taillight and therefore the vehicle light may comprise a vehicle taillight.

In some embodiments, the plurality of grooves may define a plurality of pointed projections. In some such embodiments, the plurality of grooves may be defined by a plurality of cone-shaped members each having a pointed projection.

In alternative embodiments, the plurality of grooves may comprise elongated grooves. In some such embodiments, the grooves may be formed in parallel rows, wherein each groove extends from one end of the groove pattern to an opposite end of the groove pattern similar to a plurality of waves. In some embodiments, the pointed projections may comprise rounded tips. Alternatively, the pointed projections may comprise sharp tips.

In some embodiments, the plurality of parallel rows may comprise a periodicity distance that is less than about $1/10$ of a free-space wavelength of electromagnetic radiation from the RADAR module. In some such embodiments, the plurality of parallel rows may comprise a periodicity distance that is between about $1/20$ and about $1/10$ of a free-space wavelength of electromagnetic radiation from the RADAR module In some embodiments, the RADAR module may be configured to generate polarized electromagnetic radiation, and the plurality of elongated grooves may be positioned and configured to extend in a direction at least substantially perpendicular to an axis of polarization of electromagnetic radiation from the RADAR module.

In a specific example of a RADAR assembly according to some embodiments, the assembly may comprise a RADAR module and a housing. The assembly may further comprise a surface having a plurality of parallel grooves defining a plurality of pointed projections. The plurality of grooves may be configured to decrease the reflectivity of electromagnetic radiation from the RADAR module relative to the housing. The surface may be part of and/or positioned on a material/element, which material/element may, in some embodiments, be part of the housing. The material/element upon which the surface is formed may have a thickness.

In some embodiments, the plurality of parallel grooves may be configured to reduce an effective thickness of the surface relative to electromagnetic radiation from the RADAR module. In some embodiments, the RADAR module may be configured to generate polarized electromagnetic radiation. In some such embodiments, the groove pattern may be positioned relative to the RADAR module such that the plurality of parallel grooves extends in a direction at least substantially perpendicular to an axis of polarization of electromagnetic radiation from the RADAR module.

In some embodiments, the plurality of parallel grooves may comprise a periodicity distance that is between about $1/20$ and about $1/4$ of a free-space wavelength of electromagnetic radiation from the RADAR module. In some such embodiments, the plurality of parallel grooves may comprise a periodicity distance that is between about $1/20$ and about $1/10$ of a free-space wavelength of electromagnetic radiation from the RADAR module.

In a specific example of a method for decreasing the RADAR reflectivity of a thermoplastic material according to certain implementations, the method may comprise the steps of obtaining a material block, such as a thermoplastic material block, configured to be positioned adjacent to a vehicle RADAR module and forming a groove pattern in a surface of the material block. In some implementations, the groove pattern may comprise a plurality of grooves defining a plurality of pointed projections. The groove pattern may be configured to decrease the RADAR reflectivity of the material block relative to RADAR from the vehicle RADAR module. The method may further comprise positioning the vehicle RADAR module in a position so as to transmit radio waves through the groove pattern.

Some implementations may further comprise performing a multi-shot injection molding process to form the material block. In some such implementations, the groove pattern may be formed on a surface formed by only one shot of the multi-shot injection molding process.

In some implementations, the multi-shot injection molding process may comprise a two-shot injection molding process, wherein a first shot of the two-shot injection molding process forms a first material block layer, and wherein a second shot of the two-shot injection molding process forms a second material block layer. In some implementations, the second shot may apply a material layer the same thickness as the first shot such that the two layers are identical, or at least substantially identical, to each other. The groove pattern may decrease the RADAR reflectivity of the material block relative to the RADAR reflectivity of the first material block layer and relative to the material block having both the first material block layer and the second material block layer without the groove pattern, which may allow for creating an effective thickness that is in between that of a material block having only the first shot and one having both the first and second shots. The two material block layers may, but need not, have the same thicknesses.

The features, structures, steps, or characteristics disclosed herein in connection with one embodiment may be combined in any suitable manner in one or more alternative embodiments.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of apparatus, systems, and methods consistent with various embodiments of the present disclosure is provided below. While several embodiments are described, it should be understood that the disclosure is not limited to any of the specific embodiments disclosed, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

Apparatus, methods, and systems are disclosed herein relating to roughened and/or grooved surfaces, for use in connection with RADAR assemblies and in connection with other elements configured to deliver other electromagnetic radiation. The surface treatments disclosed herein may serve to decrease an effective thickness of the material on which the treatment is formed to reduce its reflectivity relative to radio waves or other electromagnetic radiation with which the material will be used. In some embodiments, the inventive principles disclosed herein may also de-cohere reflected RADAR signals or other electromagnetic radiation to improve sensor functionality.

The embodiments of the disclosure may be best understood by reference to the drawings, wherein like parts may be designated by like numerals. It will be readily understood that the components of the disclosed embodiments, as generally described and illustrated in the figures herein, could be arranged and designed in a wide variety of different configurations. Thus, the following detailed description of the embodiments of the apparatus and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. Additional details regarding certain preferred embodiments and implementations will now be described in greater detail with reference to the accompanying drawings.

Figure 1:
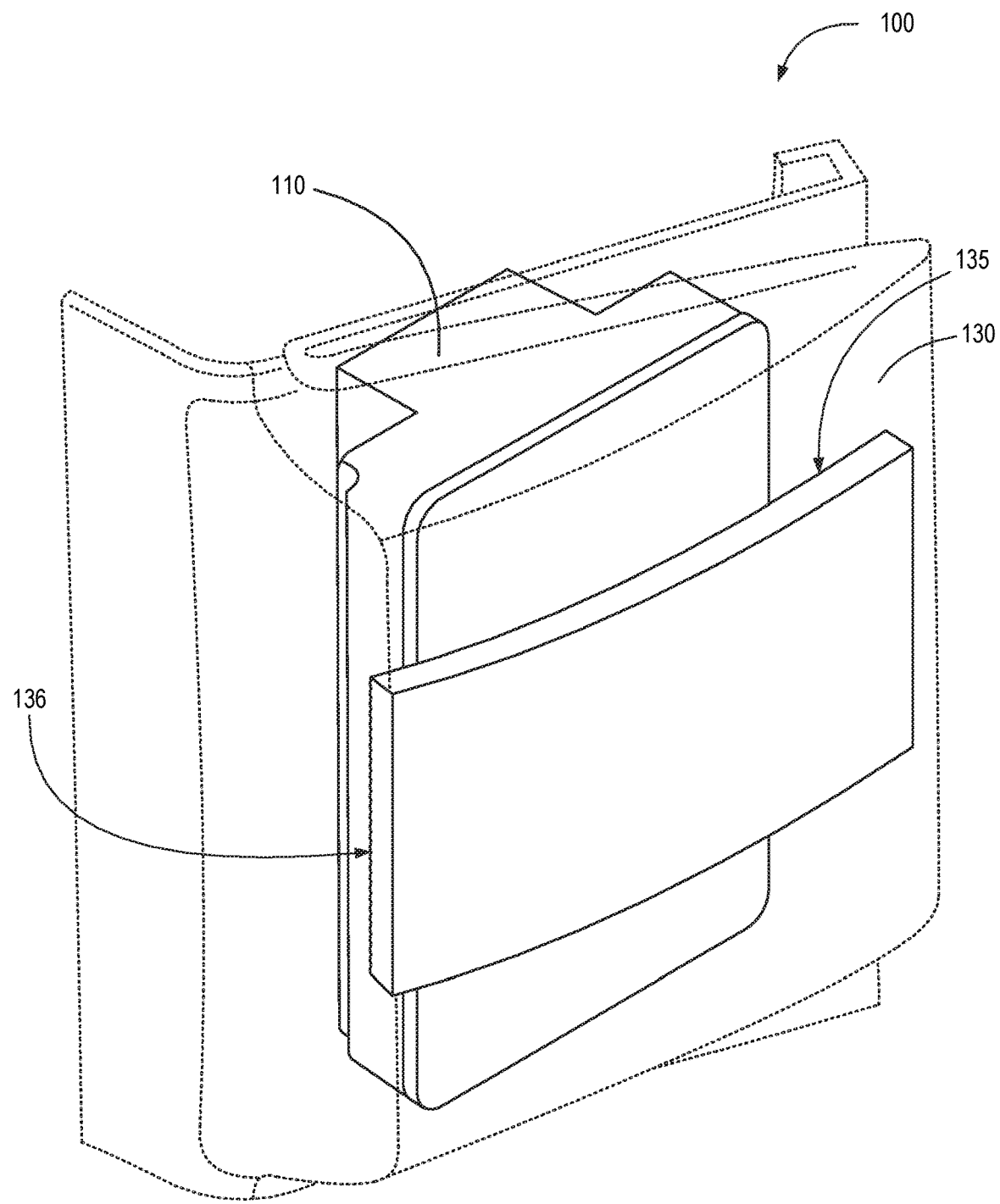
FIG. 1 depicts a vehicle light assembly according to some embodiments.

FIG. 1 depicts a vehicle light assembly 100. Vehicle light assembly 100 comprises a vehicle taillight assembly. However, as those of ordinary skill in the art after receiving the benefit of this disclosure will appreciate, the inventive principles set forth herein may be applied to other light assemblies, vehicle or otherwise, or other assemblies used in connection with RADAR sensors. Vehicle light assembly 100 comprises a RADAR module 110 including one or more RADAR sensors 112 (see FIG. 2), a light 120 (see FIG. 2), and a housing 130.

Figure 2:
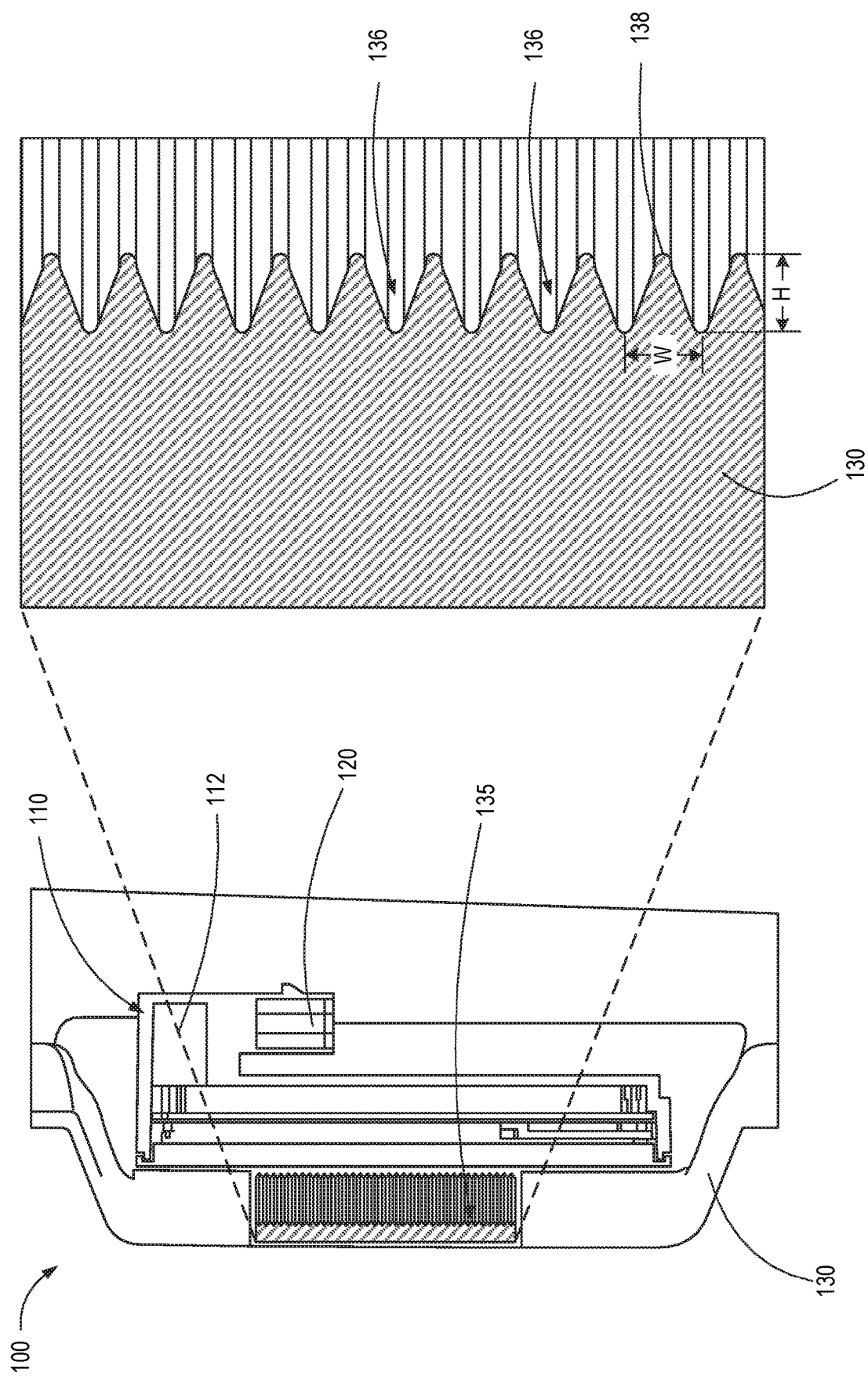
FIG. 2 is a cross-sectional view of the vehicle light assembly of FIG. 1.

Vehicle light assembly 100 further comprises a surface 135 comprising a plurality of grooves 136. Surface 135 may be a portion of an interior surface of housing 130, as shown in FIG. 2. However, in alternative embodiments, surface 135 may be part of a separate component, such as a panel or insert, or may be part of the RADAR module 110 itself. At least a portion of surface 135 of housing 130 comprises a plurality of grooves 136 formed therein. In some embodiments, the entire inner surface 135 of housing 130 may comprise grooves 136. However, in some embodiments, just a selected portion, such as a portion adjacent to one or more RADAR antennae, may be so grooved.

Grooves 136 are preferably configured to decrease the reflectivity of electromagnetic radiation from the RADAR sensor(s) 112 of RADAR module 110 relative to the housing 130. Without being limited by theory, it is thought that one or more of the configurations and/or inventive principles disclosed herein may decrease reflectivity, and in some cases may de-cohere a reflected RADAR signal, thereby mitigating target-bearing influence, by adjusting an effective thickness of a material adjacent to one or more RADAR sensors to a thickness less reflective of RADAR or other electromagnetic radiation at the particular frequency of the RADAR or other electromagnetic radiation used by the module(s)/sensor(s). As discussed in greater detail below, this may be particularly useful in connection with multi-shot injection molded parts, such as two-shot injection molded vehicle light housings.

In some embodiments, the plurality of grooves may be formed in parallel rows, which may be elongated. In some embodiments, the plurality of grooves may define a plurality of pointed projections. For example, as shown in the cross-sectional view of FIG. 2, surface 135 may comprise a plurality of elongated grooves 136 each having a pointed tip/edge 138. In the embodiment of FIG. 2, pointed tips/ edges are rounded. In addition, the troughs of each of the grooves 136 are also rounded. However, as discussed below, in alternative embodiments, the tips/edges and/or the troughs of grooves 136 may instead be sharp and may not define a radius of curvature.

In preferred embodiments, the electromagnetic radiation used adjacent to the sensor may be polarized and the groove pattern may be cross-polarized relative to the radiation. Thus, with respect to the embodiment of FIGS. 1 and 2, RADAR module 110 may be configured to generate polarized radio waves and the plurality of elongated grooves 136 may be formed to extend in a direction at least substantially perpendicular to an axis of polarization of the radio waves from the RADAR module 110. This may improve the ability of surface 135 to avoid undesirable RADAR reflection.

One or more of the dimensions of grooves 136 may also be tailored to the electromagnetic radiation of an adjacent module/sensor. For example, as shown in FIG. 2, grooves 136 may be formed to have a periodicity distance or width "W." Distance W is preferably less than about 1/10 of a free-space wavelength of electromagnetic radiation from RADAR module 110. In some such embodiments, distance W may be between about 1/20 and about 1/10 of a free-space wavelength of electromagnetic radiation from RADAR module 110. However, in some embodiments, it may be acceptable to have distance W be between about 1/20 and about 1/4 of a free-space wavelength of electromagnetic radiation from RADAR module 110. In still other embodiments, distance W may be between about 1/15 and about 1/8 of a free-space wavelength of electromagnetic radiation from RADAR module 110.

Figure 3:
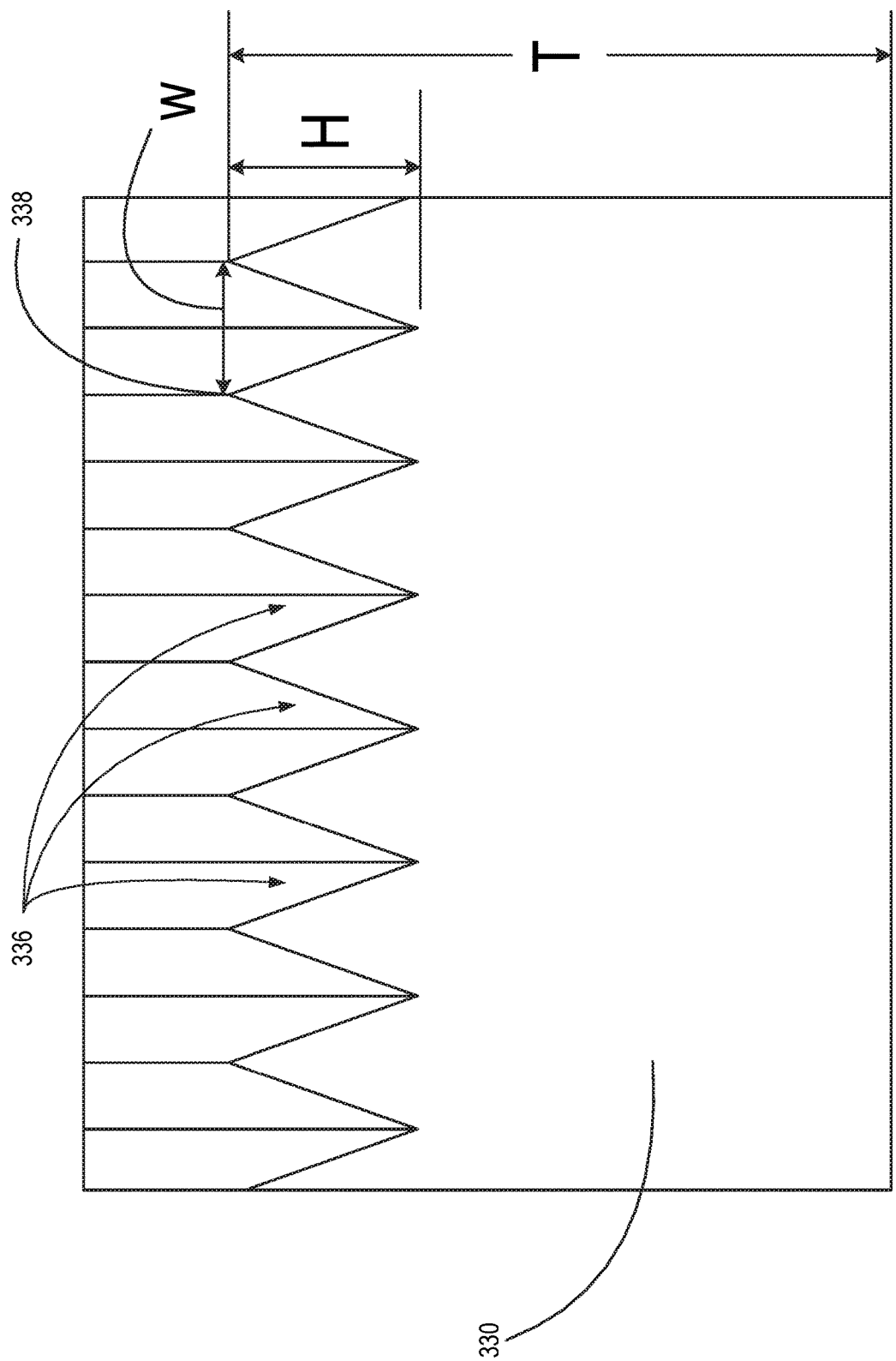
FIG. 3 depicts an alternative groove pattern that may be formed on a surface adjacent to a RADAR sensor, such as on a surface of a vehicle tail light housing.

FIG. 3 illustrates an alternative groove pattern that may be formed on a surface of a material block 330 positioned adjacent to a RADAR sensor and/or assembly. The grooves 336 of the groove pattern of FIG. 3 define a series of parallel pointed projections that are in the shape of triangles in cross-section (preferably grooves 336 extend in parallel rows along the surface of material block 330) and have sharp tips 338 and corresponding sharp troughs in between adjacent tips 338 rather than the rounded tips/troughs of the embodiment depicted in FIG. 2. In addition, FIG. 3 shows that the material block 330 may comprise a thickness T and that the grooves 336 have a height "H." In some embodiments, grooves 336 may be formed to have a height H that reduces the effective thickness of material block 330, from the perspective of radio waves or other electromagnetic radiation from an adjacent antenna/sensor, to a desired percentage of T. For example, in some embodiments, the effective thickness of the material block 330 may be about T−H/2.

In addition, as previously discussed, in some embodiments, grooves 336 may be formed to have a periodicity distance or width "W" that is less than about 1/10 of a free-space wavelength of electromagnetic radiation from an adjacent RADAR module/sensor.

Figure 4:
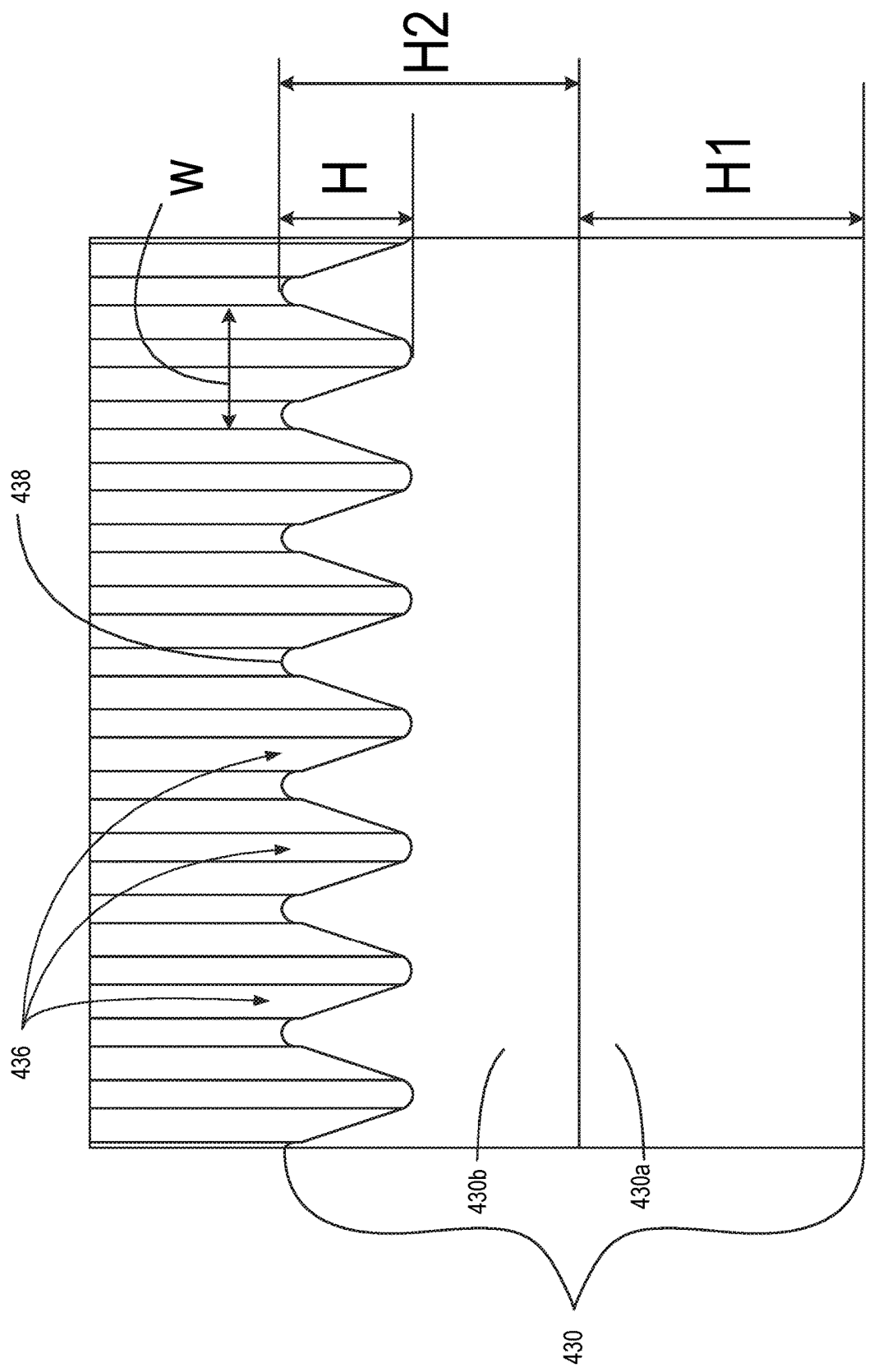
FIG. 4 depicts a groove pattern applied to a two-shot injection molded material block.

FIG. 4 illustrates yet another alternative groove pattern that may be formed on a surface of a material block 430, which may be coupled with and/or positioned adjacent to a RADAR sensor and/or assembly. The grooves 436 of the groove pattern of FIG. 4 define a series of parallel pointed projections that are in the shape of triangles in cross-section (preferably grooves 436 extend in parallel rows along the surface of material block 430) and have rounded tips 438 and corresponding rounded troughs in between adjacent tips 438. In some embodiments, tips 438 and/or their corresponding troughs may have a radius of curvature of about 0.125 mm.

In the embodiment of FIG. 4, material block 430 comprises two portions or layers, namely, portion 430a and portion 430b. In some embodiments and implementations, these portions may represent portions of a material block formed in a multi-shot injection molding process. For example, portion 430a may represent the result of a first injection molding process and portion 430b may represent the result of a second injection molding process. By forming a surface treatment, such as grooves 436, on a surface of portion 430b, a housing or other material that would be relatively reflective to RADAR or other electromagnetic radiation from an adjacent module/sensor/antenna were the housing/material to have either the thickness of section 430a alone or the thickness of combined portions 430a and 430b but without a surface treatment can be made substantially less reflective. In addition, by providing a groove pattern or other suitable surface treatment using the principles disclosed herein, the coherence of reflected signals originating from the adjacent RADAR sensor or other electromagnetic radiation generated may be disrupted.

More particularly, in a specific example of a method for decreasing reflectivity of a material used in connection with a RADAR module/sensor and/or otherwise improving the characteristics of the material in relation to RADAR signals passing therethrough, the material may comprise a thermoplastic material that yields only predefined thicknesses depending upon the number of shots/stages in a multi-step injection molding process. Thus, for example, in connection with certain rear taillight housings, a single-shot injection molding process may yield a thickness of about 2.5 mm, as shown at H1 in FIG. 4. For 24 GHz RADAR signals, this material thickness is typically highly reflective. A two-shot injection molding process may yield a thickness of about twice that of the single-shot process, or about 5.0 mm, as represented by H2 in FIG. 4. However, again, for 24 GHz RADAR signals, this thickness is also highly reflective and may not improve, or at least significantly improve, upon the characteristics of the single-shot material (again, represented by portion 430a) relative to adjacent RADAR signals. It should also be understood that the inventive principles disclosed herein may apply to a wide variety of other frequencies, including other radio wave frequencies and possibly even frequencies outside of the radio wave band.

Thus, to both improve upon the reflectivity characteristics of the housing/material 430, and to provide other benefits, such as reflected signal de-coherence, the surface of portion 430b may be grooved or otherwise applied with a roughened surface. Thus, in some embodiments comprising a groove pattern defined by a plurality of parallel grooves 436 and comprising or configured for use in connection with 24 GHz RADAR signals/sensors, grooves 436 may be formed with a periodicity or width W between grooves 436 of between about 0.62 mm and about 3.13 mm. In some such embodiments, grooves 436 may be formed with a periodicity or width W between grooves 436 of between about 0.62 mm and about 1.25 mm.

In addition, when configured for use in connection with 24 GHz RADAR signals/sensors, the grooves 436 may have a height "H" of between about 1.2 mm and about 2.0 mm.

Thus, to provide a very specific example of groove dimensions suitable for use in connection with 24 GHz RADAR signals/sensors according to some embodiments, thickness H1 of portion/layer 430a may be about 2.5 mm, thickness H2 of portion/layer 430b may also be about 2.5 mm, and height H of grooves 436 may be about 1.5 mm. In this manner, as mentioned above, a two-shot injection molded housing or other part may be made substantially less reflective to RADAR signals and also de-cohere reflected signals.

Figure 5:
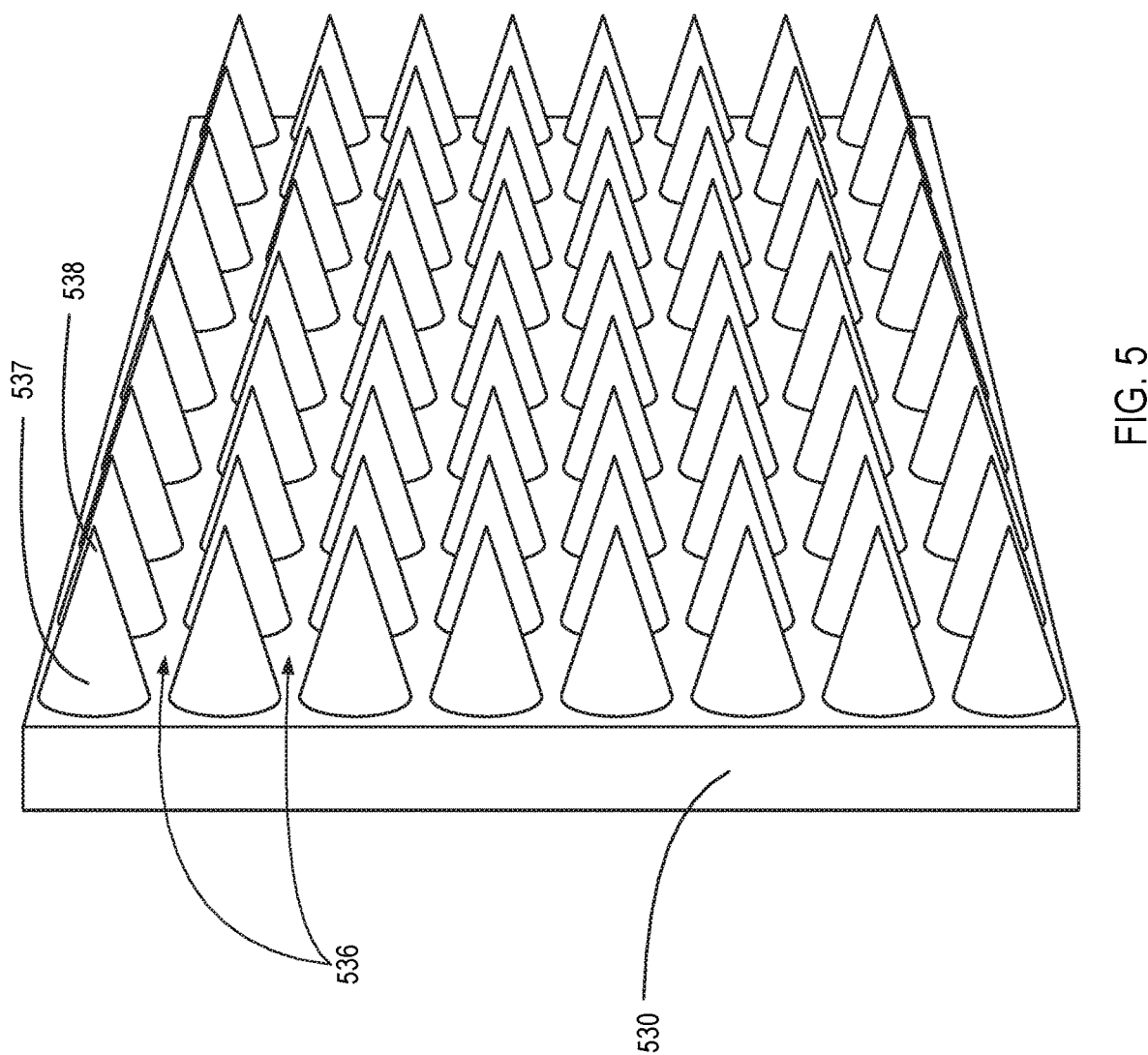
FIG. 5 depicts another alternative groove pattern that may be formed on a surface adjacent to a RADAR sensor, such as on a surface of a vehicle tail light housing.

FIG. 5 illustrates still another alternative groove pattern that may be formed on a surface of a material block 530, which may be coupled with and/or positioned adjacent to a RADAR sensor and/or assembly. The grooves 536 of the groove pattern of FIG. 5 are defined by a plurality of cone-shaped members 537 each having a pointed tip 538. In addition, although cone-shaped members 537 are formed in parallel rows, unlike the previously-described embodiments, members 537 define two sets of parallel rows that extend perpendicular to one another.

Although the specific surface treatment patterns/formations shown in the accompanying figures may be preferred for certain application, it should be understood that a variety of alternative such patterns/formations are contemplated. For example, instead of triangle-shaped grooves, the grooves may instead be formed with a sinusoidal shape in cross-section. However, in preferred embodiments, the tips of the adjacent projections forming the grooves are pointed, as mentioned above. As another alternative, rather than providing a series of adjacent cone-shaped members 537, as depicted in FIG. 5, in alternative embodiments these members may have a variety of alternative shapes, such as pyramid shapes, cylinder shapes, ball shapes, irregular bumps, etc. In some embodiments, a plurality of sub-wavelength sized features, such as periodic depressions and/or embossments, may be provided. In some such embodiments, these features may have a periodicity of multiple iterations per free-space wavelength.

The foregoing specification has been described with reference to various embodiments and implementations. However, one of ordinary skill in the art will appreciate that various modifications and changes can be made without departing from the scope of the present disclosure. For example, various operational steps, as well as components for carrying out operational steps, may be implemented in various ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

Those having skill in the art will appreciate that many changes may be made to the details of the above-described embodiments without departing from the underlying principles of the invention. The scope of the present inventions should, therefore, be determined only by the following claims.

The invention claimed is:

1. A vehicle light assembly, comprising:
a RADAR module;
a vehicle light; and
a housing enclosing the RADAR module and the vehicle light,
wherein at least a portion of the housing configured to allow light from the vehicle light to pass therethrough comprises a plurality of grooves,
wherein the plurality of grooves is configured to decrease the reflectivity of electromagnetic radiation from the RADAR module relative to the at least a portion of the housing,
wherein the plurality of grooves comprises a plurality of elongated grooves,
wherein the plurality of elongated grooves is formed in parallel rows, and
wherein the plurality of parallel rows comprises a periodicity distance that is less than about $1/10$ of a free-space wavelength of electromagnetic radiaiton from the RADAR module.

2. The vehicle light assembly of claim 1, wherein the vehicle light comprises a vehicle taillight.

3. The vehicle light assembly of claim 1, wherein the plurality of grooves defines a plurality of pointed projections.

4. The vehicle light assembly of claim 3, wherein the plurality of grooves are defined by a plurality of cone-shaped members each having a pointed projection.

5. The vehicle light assembly of claim 3, wherein the pointed projections comprise rounded tips.

6. The vehicle light assembly of claim 5, wherein the plurality of grooves comprises elongated grooves formed in parallel rows.

7. The vehicle light assembly of claim 1, wherein the RADAR module is configured to generate polarized electromagnetic radiation, and wherein the plurality of elongated grooves extend in a direction at least substantially perpendicular to an axis of polarization of electromagnetic radiation from the RADAR module.

8. A RADAR assembly, comprising:
a RADAR module;
a light;
a housing comprising an at least partially transparent material, wherein the transparent material is configured to allow visible light from the light to pass therethrough; and
a surface of the at least partially transparent material having a plurality of parallel grooves defining a plurality of pointed projections, wherein the plurality of grooves is configured to decrease the reflectivity of electromagnetic radiation from the RADAR module relative to the housing, wherein the surface is positioned on a material having a thickness, wherein the RADAR module is configured to generate polarized electromagnetic radiation, and wherein the groove pattern is positioned relative to the RADAR module such that the plurality of parallel grooves extends in a direction at least substantially perpendicular to an axis of polarization of electromagnetic radiation from the RADAR module.

9. The RADAR assembly of claim 8, wherein the surface is part of the housing.

10. The RADAR assembly of claim 8, wherein the plurality of parallel grooves is configured to reduce an effective thickness of the material relative to electromagnetic radiation from the RADAR module.

11. The RADAR assembly of claim 8, wherein the plurality of parallel grooves comprises a periodicity distance that is between about $1/15$ and about $1/8$ of a free-space wavelength of electromagnetic radiation from the RADAR module.

12. A method for decreasing the RADAR reflectivity of a thermoplastic material, the method comprising the steps of:
obtaining a material block configured to be positioned adjacent to a vehicle RADAR module;

forming a groove pattern in a surface of the material block, wherein the groove pattern comprises a plurality of grooves defining a plurality of pointed projections, wherein the groove pattern decreases the RADAR reflectivity of the material block relative to RADAR from the vehicle RADAR module; and positioning the vehicle RADAR module in a position so as to transmit radio waves through the groove pattern, wherein the multi-shot injection molding process comprises a two-shot injection molding process, wherein a first shot of the two-shot injection molding process forms a first thermoplastic material layer, wherein a second shot of the two-shot injection molding process forms a second thermoplastic material layer, wherein the groove pattern decreases the RADAR reflectivity of the thermoplastic material block relative to the RADAR reflectivity of the first thermoplastic material layer and relative to the thermoplastic material block having both the first thermoplastic material layer and the second thermoplastic material layer without the groove pattern, and wherein the groove pattern is formed in material of the second shot.

13. The method of claim 12, wherein the material block comprises a thermoplastic material block.

14. The vehicle light assembly of claim 1, wherein each of the plurality of grooves has a depth of between about 1.2 mm and about 2.0 mm.

15. The vehicle light assembly of claim 1, wherein each of the plurality of grooves has a periodicity of between about 0.62 mm and about 3.13 mm.

16. The vehicle light assembly of claim 15, wherein each of the plurality of grooves has a periodicity of between about 0.62 mm and about 1.25 mm.

* * * * *